United States Patent
Byrkett

(10) Patent No.: US 7,705,600 B1
(45) Date of Patent: Apr. 27, 2010

(54) VOLTAGE STRESS TESTING OF CORE BLOCKS AND REGULATOR TRANSISTORS

(75) Inventor: Bruce Byrkett, Preston, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 102 days.

(21) Appl. No.: 11/705,986

(22) Filed: Feb. 12, 2007

Related U.S. Application Data

(60) Provisional application No. 60/773,000, filed on Feb. 13, 2006, provisional application No. 60/773,001, filed on Feb. 13, 2006.

(51) Int. Cl.
 *G01R 31/02* (2006.01)
 *G11C 29/00* (2006.01)

(52) U.S. Cl. .................... 324/416; 365/201

(58) Field of Classification Search ............ 324/416, 324/415, 522, 527, 763, 765, 769, 158.1, 324/76.11; 365/201; 716/4; 702/64, 108, 702/127
See application file for complete search history.

(56) References Cited

U.S. PATENT DOCUMENTS

| | | | |
|---|---|---|---|
| 4,217,610 A | 8/1980 | Jurgensen et al. | |
| 5,086,280 A | 2/1992 | Ohmura et al. | |
| 5,124,573 A | 6/1992 | Wong | |
| 5,202,640 A * | 4/1993 | Schaaf et al. | 324/537 |
| 5,410,195 A | 4/1995 | Ichihara | |
| 5,452,253 A * | 9/1995 | Choi | 365/201 |
| 5,610,546 A | 3/1997 | Carbou et al. | |
| 5,621,355 A | 4/1997 | Williams et al. | |
| 5,767,719 A | 6/1998 | Furuchi et al. | |
| 5,848,010 A * | 12/1998 | Sher | 365/201 |
| 5,909,398 A * | 6/1999 | Tanzawa et al. | 365/185.29 |
| 6,009,029 A * | 12/1999 | Sher | 365/201 |
| 6,043,717 A | 3/2000 | Kurd | |
| 6,100,739 A | 8/2000 | Ansel et al. | |
| 6,175,928 B1 | 1/2001 | Liu et al. | |
| 6,327,318 B1 | 12/2001 | Bhullar et al. | |
| 6,445,238 B1 | 9/2002 | Lesea | |
| 6,445,661 B1 | 9/2002 | Wu | |
| 6,650,105 B2 * | 11/2003 | Chen | 324/158.1 |
| 6,747,492 B2 | 6/2004 | Govil et al. | |
| 6,819,157 B2 | 11/2004 | Cao et al. | |
| 6,917,236 B2 | 7/2005 | Doutreloigne et al. | |
| 7,019,576 B1 | 3/2006 | Sancheti et al. | |
| 7,265,495 B2 | 9/2007 | Date | |
| 7,323,923 B2 | 1/2008 | Maeda et al. | |

(Continued)

FOREIGN PATENT DOCUMENTS

JP 404227314 A1 8/1992

OTHER PUBLICATIONS

U.S. Appl. No. 09/150,551: "Self-Timed Synchronous Pulse Generator with Test Mode," Ansel et al., filed on Sep. 9, 1998; 18 pages.

(Continued)

*Primary Examiner*—Hoai-An D Nguyen

(57) ABSTRACT

An apparatus and method for disabling an internal voltage regulator of a circuit to voltage stress test the circuit. The apparatus may include a circuit having an internal voltage regulator and a design-for-test circuit coupled to the circuit to disable the internal voltage regulator to voltage stress test the circuit in a test mode.

13 Claims, 8 Drawing Sheets

U.S. PATENT DOCUMENTS 7,428,675 B2 * 9/2008 Gattiker et al. .............. 714/726
7,456,885 B2 11/2008 Baker

OTHER PUBLICATIONS

USPTO Non-Final Rejection for U.S. Appl. No. 09/150,551 dated Nov. 12, 1999; 7 pages.

USPTO Notice of Allowance for U.S. Appl. No. 09/150,551 dated Mar. 24, 2000; 5 pages.

U.S. Appl. No. 11/705,985; "Controlling a High-Voltage Switch with Low-Voltage Control Signals," Bruce Byrkett, filed on Feb. 12, 2007; 48 pages.

USPTO Notice of Allowance for U.S. Appl. No. 11/705,985 dated May 14, 2009; 7 pages.

USPTO Advisory Action for U.S. Appl. No. 11/705,985 dated Apr. 10, 2009; 3 pages.

USPTO Final Rejection for U.S. Appl. No. 11/705,985 dated Feb. 6, 2009; 7 pages.

USPTO Non-Final Rejection for U.S. Appl. No. 11/705,985 dated Sep. 10, 2008; 7 pages.

U.S. Appl. No. 10/804,988: "Delay Circuit that Scales with Clock Cycle Time," Sancheti et al., filed on Mar. 18, 2004; 26 pages.

USPTO Notice of Allowance for U.S. Appl. No. 10/804,988 dated Jun. 8, 2005; 7 pages.

USPTO Notice of Allowance for U.S. Appl. No. 10/804,988 dated Oct. 20, 2005; 7 pages.

* cited by examiner

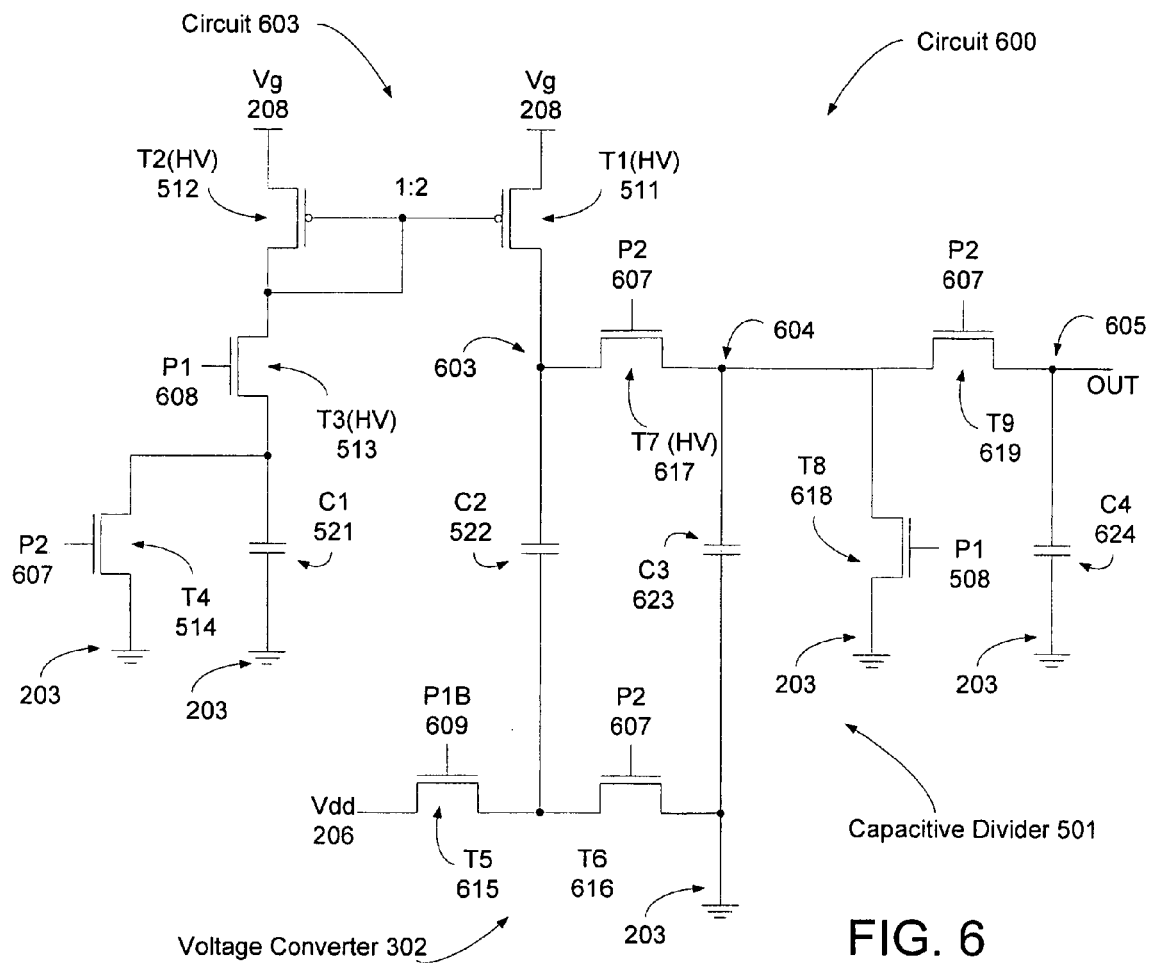
FIG. 6
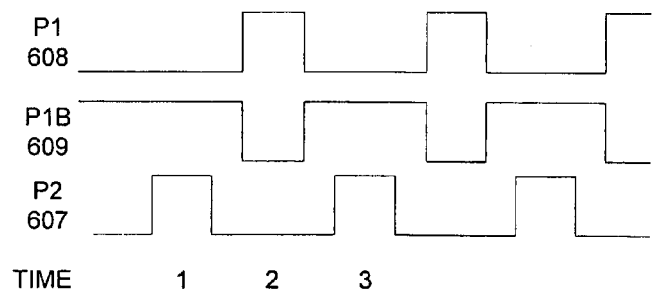

VOLTAGE STRESS TESTING OF CORE BLOCKS AND REGULATOR TRANSISTORS

RELATED APPLICATIONS

This application claims the benefit of U.S. Provisional Application No. 60/773,000, filed Feb. 13, 2006, and U.S. Provisional Application No. 60/773,001, filed Feb. 13, 2006.

TECHNICAL FIELD

This invention relates generally to a switch and, more particularly, to controlling a high-voltage switch.

BACKGROUND

When devices, such as packaged integrated circuits (or "chips") are built, it is conventional to stress test either each device or a sample of the devices that are built before shipping the devices to the customer.

One type of device is a programmable system on a chip device, for example, a PSoC® device manufactured by Cypress Semiconductor Corporation. A majority of internal logic components of a programmable system on a chip device are protected from a high-voltage supply by internal voltage regulators. The internal voltage regulators allow circuit designers to build the logic circuits with low-voltage transistors, as opposed to costly high-voltage transistors (also referred to as high-voltage switches). However, currently there are no external mechanisms to stress test these internal voltage regulated areas of the chip. Circuits that do not have internal voltage regulators can be run at higher voltages to determine problems with the circuit. However, areas of a chip that are regulated by an internal voltage regulator can not be run at higher voltages because the internal voltage regulator is designed to protect the circuitry from higher voltages.

Design for testing (DFT) is one means for chip manufacturers to supplement or supplant traditional functional testing role in which chips are tested at their input/outputs (I/O) for functional performance. The tests generally are driven by test programs that execute in automatic test equipment or inside the assembled chip itself. Conventional DFT methodologies include on-chip testing of device sub-blocks to indicate the presence of defects (i.e., the test fails) of circuitry within a chip. However, currently there are no DFT circuits to stress test areas of the chip (e.g., internal logic components) that are protected from the high-voltage supply by internal voltage regulators.

Conventional internal voltage regulators can include a high-voltage transistor, such as a regulator FET. High voltages are usually measured by dividing the high voltage down for comparison with lower voltage references. Resistive or capacitive dividers are commonly used. If the high voltage to be measured is also high impedance, then resistive dividers must use large valued resistors which are expensive in terms of die area. Capacitive dividers can perform the same function in less die area, but require high-voltage switches. High-voltage switches commonly require high-voltage control signals. The generation of these high-voltage control signals usually involves creating a high-voltage power supply with a charge pump and using level shifters to shift logic level control signals up to high voltages.

BRIEF DESCRIPTION OF THE DRAWINGS

The present invention is illustrated by way of example, and not by way of limitation, in the figures of the accompanying drawings.

FIG. 6 illustrates a schematic of one embodiment of a circuit having a capacitive divider having a circuit for controlling high-voltage transistors using low-voltage control signals, and a voltage converter.

DETAILED DESCRIPTION

Figure 1:
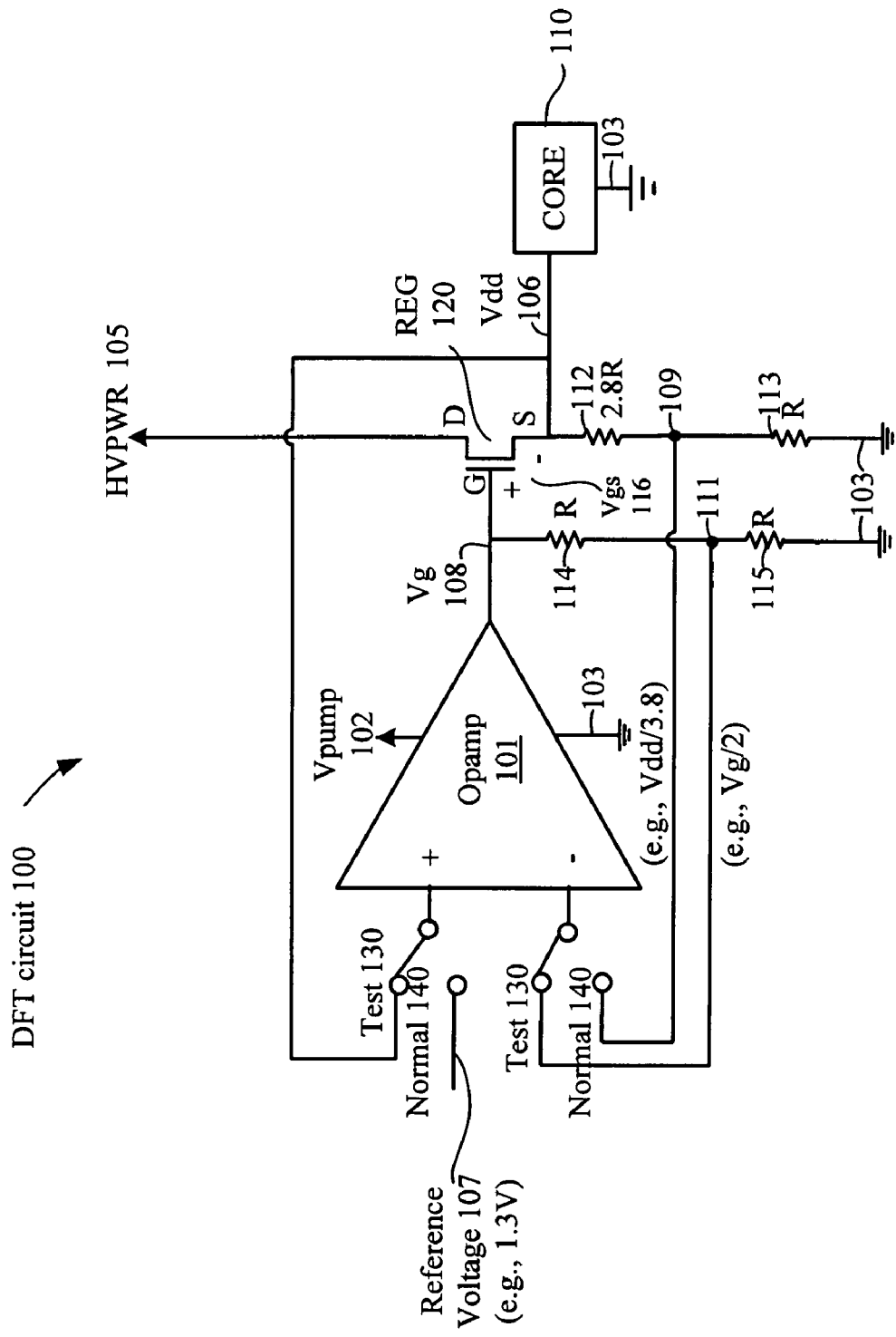
FIG. 1 illustrates one embodiment of a DFT circuit for voltage stress testing a core block within a device using a linear regulator.

Described herein is an apparatus and method for disabling an internal voltage regulator of a circuit to voltage stress test the circuit. Also, described herein is an apparatus and method for controlling a high-voltage switch with low-voltage control signals. In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "coupled" as used herein may include both directly coupled and indirectly coupled through one or more intervening components. It should be noted that although the apparatus and methods may be described herein in relation to a programmable system on a chip device for ease of explanation, the apparatus and methods described herein may be applied to the development of other devices (e.g., controllers). As used herein, "high voltage" may be approximately in a range of 5 to 36V and "low voltage" may be approximately in a range of 0 to 5V.

The embodiments described below may be configured to voltage stress test internally regulated core circuitry and the gate oxide of the internal regulator FET itself. Testing can be performed quickly and inexpensively. The testing may be implemented using a selectable divider circuit, which manipulates a regulator gate control feedback loop to disable the regulator FET from protecting the internally regulated circuitry. Also, as described above, the normal mode or the test mode may be selectable via a microprocessor's or microcontroller's programmable register.

Also described below are embodiments for controlling a high-voltage switch with low-voltage control signals. While it may be readily apparent to turn a high-voltage PFET "on" by driving its gate to ground, turning a high-voltage PFET "off" with low-voltage control signals is not so apparent. It should be noted that the high-voltage transistors (also known as high-voltage switches) as described herein may have the same threshold voltage (e.g., gate-to-source voltage required to turn the transistor on) as low-voltage transistors. However, the high-voltage transistors are configured to tolerate a much higher maximum allowable drain-to-source voltage than low-voltage transistors. In addition, the high-voltage transistors, such as the PMOS transistor often have their source connected to high voltages so the gate voltage (Vg) to control these high-voltage transistors must also be a high voltage. For example, a "turned on" high-voltage PMOS transistor might have a voltage at the source of approximately 35V, a voltage on the drain of approximately 30V, a voltage at the gate of approximately 30V, and the gate-to-source voltage Vgs is approximately −5V; and a "turned off" high-voltage PMOS transistor might have a voltage at the source of approximately 35V, a voltage at the drain of approximately 0V, a voltage at the gate of approximately 35V, and the gate-to-source voltage Vgs is approximately 0V.

An apparatus and a method of voltage stress testing internal circuitry, such as core blocks, that are internally voltage regulated and a regulator field-effect-transistor (FETs) of the internal voltage regulator are described. The embodiments described herein are configured to disable the internal voltage regulator in order to stress tests circuits that are otherwise protected by the internal voltage regulator. Once the internal voltage regulator has been disabled, a voltage can be applied to the core block that is higher than a maximum voltage allowed by the internal voltage regulator. The embodiments described herein are also configured to stress test the circuitry that is protected by the internal voltage regulator (e.g., core block), as well as the internal voltage regulator itself (e.g., applying a higher gate-to-source voltage on a regulator FET of the internal voltage regulator). The circuits that are protected by an internal voltage regulator may be a processing device, such as the PSoC® device manufactured by Cypress Semiconductor Corporation of San Jose, Calif., an analog-to-digital converter, a digital-to-analog converter, a random access memory (RAM) cell, or other circuits that use an internal voltage regulator.

The apparatus may be implemented as a DFT circuit. In one embodiment, the DFT circuit enables voltage stress testing of core blocks that are internally voltage regulated. The DFT circuit provides a test mode that enables insertion of higher voltages into the core block than internal regulators allow during normal operation. The DFT circuit provides external control (e.g., external mechanism, such as knobs/handles) for voltage stress testing internal circuitry that otherwise would not be accessible for such testing. The DFT circuit also may be configured to voltage stress tests the internal voltage regulator FET itself.

The embodiments described herein may provide an economical method of controlling high-voltages switches with low-voltage control signals.

FIG. 1 illustrates one embodiment of a DFT circuit for voltage stress testing a core block 110 within a device using a linear regulator. DFT circuit 100 includes an operational amplifier (opamp) 101 that is configured to receive two inputs at the non-inverting input terminal (indicated by a '+' sign) and inverting input terminals (indicated by a '−' sign) for each mode, test mode 130, and normal mode 140. At both the inverting and non-inverting input terminals of the opamp 101, the DFT circuit 100 includes two switches that are configured to switch between input voltages for the test mode 130 and normal mode 140. During test mode 130, the non-inverting input terminal of the opamp 101 is coupled to the source of the regulator FET 120, and the inverting input terminal of the opamp 101 is coupled to the gate of the regulator FET 120 (by way of the resistive divider). During normal mode 140, the non-inverting input terminal of the opamp 101 is coupled to a reference voltage 107, and the inverting input terminal of the opamp 101 is coupled to the source of the regulator FET 120 (by way of the resistive divider). The opamp 101 is supplied a rail voltage of an output voltage (Vpump) 102 of a charge pump (not illustrated) with respect to a ground potential 103. The output of the opamp 101 is coupled to a gate of a regulator FET 120 (labeled REG in FIG. 1). The drain of the regulator FET 120 is coupled to a high-voltage power source 105 (HVPWR). The source of the regulator FET 120 is coupled to the input of the core block 110 and provides an output voltage Vdd 106 to the core block 110. The voltage at the source of the regulator FET 120 is the regulated, output voltage 106 (Vdd) during normal mode 140, and the unregulated, output voltage 106 (Vdd) during test mode 130. In one embodiment, the regulated, output voltage 106 (Vdd) is approximately 5.0V during normal mode 140, and the unregulated, output voltage 106 can be greater than 5.0V during test mode 130. In one embodiment, the unregulated, output voltage 106 can be in an approximate range of 5.0V to 40.0V. Alternatively, the unregulated, output voltage 106 may be other values based on the HWPWR 105.

The output voltage Vdd 106 is coupled to non-inverting input terminal of the opamp 101 when in test mode 130; when in normal mode, the non-inverting input terminal of the opamp 101 is coupled to a reference voltage 107 (e.g., 1.3V). The inverting input terminal of the opamp 101, which also depends on in which mode the DFT circuit 100 is operating, receives a fraction of either the output voltage Vg 108 of the opamp 101 or the output voltage Vdd 106 at the source of the regulator FET 120. In one embodiment, the non-inverting input terminal of the opamp 101 receives half of the output voltage Vg 108 of the opamp 101 (e.g., Vg/2) while in test mode 130, or a voltage that is approximately Vdd/3.8V (i.e., Vdd 106 divided by 3.8V). In one embodiment, these fractions are generated using voltage dividers, such as illustrated in FIG. 1. In this embodiment, two resistors are disposed between the output voltage Vdd 106 and the ground potential 103, and the first resistor 112 is approximately 2.8 larger than the second resistor 113. When in normal mode 140, the switch connects a line between the inverting input terminal of the opamp 101 and a node 109 between these two resistors 112 and 113, resulting in a voltage equal to approximately Vdd/3.8V at the inverting input terminal of the opamp 101. Two additional resistors are disposed between the output voltage Vg 108 and the ground potential, and the third resistor 114 is approximately equal in value to the fourth resistor 115. In this embodiment, the value of the second, third, and fourth resistors 113, 114, and 115 are approximately equal (e.g., R), while the first resistor 112 is approximately 2.8 R. However, when in test mode 130, the switch connects a line between the inverting input terminal of the opamp 101 and a node 111 between the third and fourth resistors 114 and 115, resulting in a voltage equal to approximately Vg/2V at the inverting input terminal of the opamp 101.

In normal mode 140, the opamp 101 forces the output voltage Vg 108 such that Vdd/3.8V (e.g., the voltage that is feedback to the input of the opamp 101 during normal mode 140) is approximately equal to 1.3V. It should be noted that the opamp 101 is designed to operate at high voltages and the charge pump must be sized to provide large currents. The supply current of the opamp 101 is the sum of the current provided to the resistive divider, for example, 5 to 50 micro Amps (IA), and the bias current of the opamp 101, for example, 5 to 50 μA. Accordingly, the total current the charge pump needs to provide is in the approximate range of 10 to 100 μA. However, in test mode 130, the opamp 101 forces the output voltage Vg 108 such that Vg/2 (e.g., the voltage that is feedback to the input of the opamp 101 during test mode 130) is approximately equal to Vdd, which is the output voltage 106 at the source of the regulator FET 120. Because Vg is approximately equal to 2 times Vdd, the gate-to-source voltage 106 (Vgs) is approximately equal to Vdd, the output voltage 108 (e.g., Vgs=Vg−Vdd=2*Vdd−Vdd=Vdd).

In test mode 130, the Vgs 106 is approximately equal to Vdd 108, causing the gate-to-source of the regulator FET 120 to be stress tested at approximately HVPWR 105. Similarly, a core block (e.g., circuit that is voltage regulated by the regulator FET 120 during normal mode 140) that is coupled to the output voltage Vdd 108 is voltage stress tested at approximately HVPWR 105, while in test mode 130. Accordingly, the regulator FET 120 can be stress tested itself, and the voltage regulator can be disabled to tests circuits that are otherwise protected by the voltage regulator.

The embodiments described above are described with respect to a linear voltage regulator having a test mode and a normal mode of operation. The linear voltage regulator, however, has the following disadvantages: First, the output of the opamp 101 needs to be capable of outputting high voltages; and second, the opamp 101 requires high current from the high voltage supply (charge pump), as described above.

The embodiments described herein of voltage stress testing a core block that is internally voltage regulated may also be implemented without the use of an operational amplifier, as described below with respect to FIG. 2.

Figure 2:
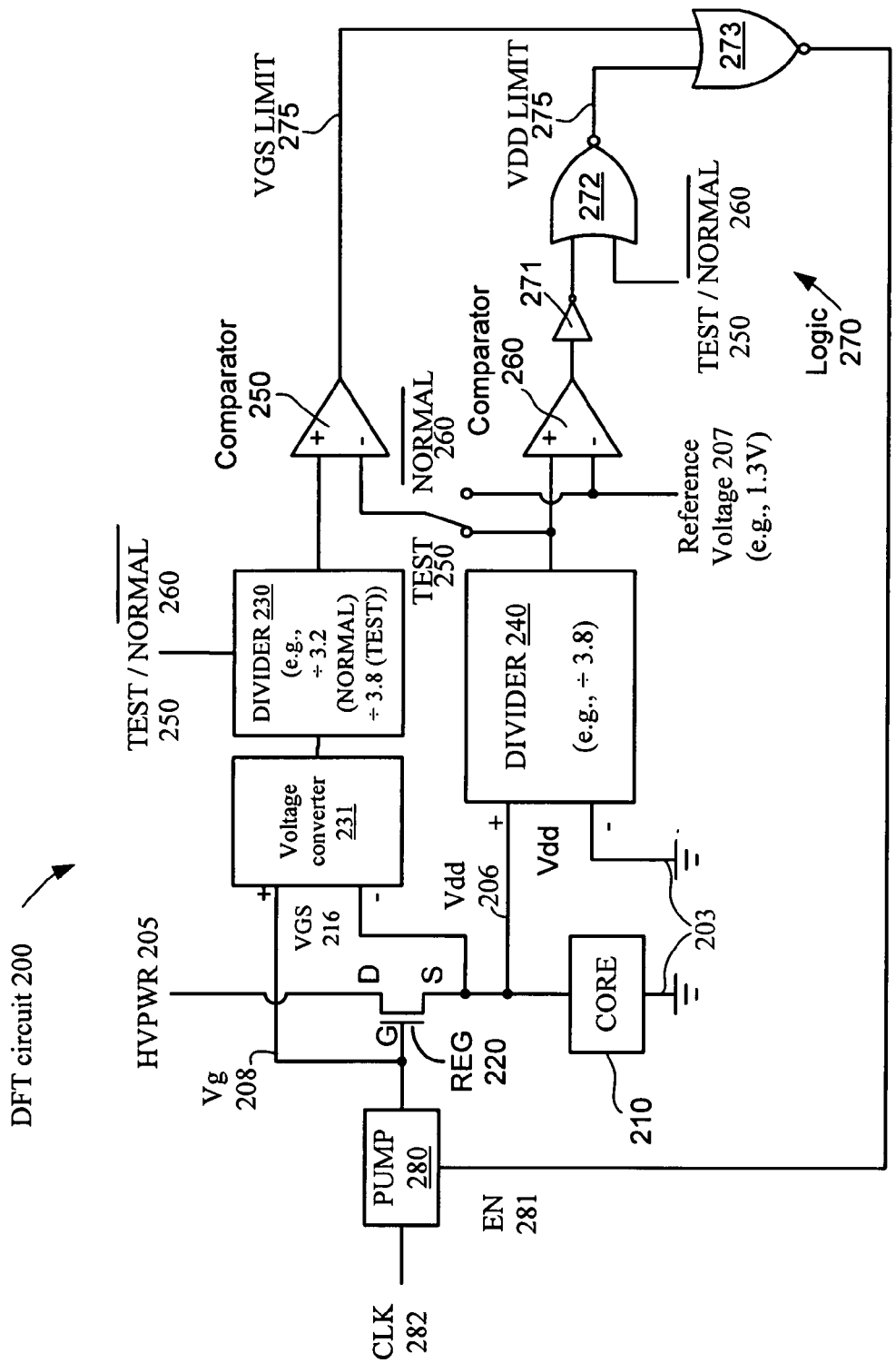
FIG. 2 illustrate a block diagram of one embodiment of a DFT circuit for voltage stress testing of a core block within a device.

FIG. 2 illustrate a block diagram of one embodiment of a DFT circuit 200 for voltage stress testing of a core block 210 within a device. The device includes DFT circuit 200 and the core block 210 (labeled CORE in FIG. 2). In this embodiment, the device is a programmable system on a chip device, for example, the PSoC® device, manufactured by Cypress Semiconductor Corporation of San Jose, Calif. Alternatively, the core blocks may reside within other types of devices, such as an analog-to-digital converter, a digital-to-analog converter, a random access memory (RAM) cell, or other circuits that use an internal voltage regulator to protect circuitry against high voltages.

In this embodiment, the core block 210 of the device is internally regulated by a regulator FET 220 (labeled REG in FIG. 2). In one embodiment, the regulator FET 220 is a high-voltage voltage NMOS FET with a threshold voltage of around 1V. The regulator FET 220 can tolerate up to approximately 40V drain-to-source voltage, but only up to approximately 5.5V gate-to-source voltage. Alternatively, PMOS FETs may be used, and the regulator FET 220 may have other values for the threshold voltage and drain-to-source and gate-to-source voltage tolerances (e.g., maximum allowable drain-to-source and gate-to-source voltages). The drain of the regulator FET 220 is coupled to a high-voltage power source 205 (HVPWR). In one embodiment, the HVPWR 205 is approximately in a range of 2.5V and 36V. Alternatively, other values may be used for HVPWR 205. The source of the regulator FET 220 is coupled to the input of the core block 210 and provides an output voltage Vdd 206 to the core block 210. The voltage at the source of the regulator FET 220 is the regulated, output voltage 206 (Vdd) during normal mode 260, and the unregulated, output voltage 206 (Vdd) during test mode 250. In one embodiment, the regulated, output voltage 206 (Vdd) is approximately 5.0V during normal mode 260, and the unregulated, output voltage 106 can be greater than 5.0V during test mode 250. In one embodiment, the unregulated, output voltage 206 can be in an approximate range of 5.0V to 40.0V. Alternatively, the unregulated, output voltage 206 may be other values based on the HWPWR 205.

As described below, the DFT circuit 200 enables voltage stress testing of the core block 210 that is otherwise internally regulated, and further enables voltage stress testing of the gate oxide of the regulator FET 220 itself.

In this embodiment, during normal operation 260, the upper divider circuit 230 is set to divide the gate-to-source voltage by a first fraction (e.g., approximately 3.2), while the lower divider circuit 240 divides by a second fraction (e.g., approximately 3.8). The divider circuits 230 and 240 are each configured to provide an output voltage that is the input voltage (e.g., differential voltage Vgs 216 or Vdd 206) divided by the given fraction (e.g., approximately 3.2 or 3.8), for example, an input voltage of 4V gives an output voltage of 1.25V for the fraction of approximately 3.2. The comparator circuits, comparators 250 and 260, are each set to compare outputs of the divider circuit against a reference voltage (e.g., 1.3V). The comparators 250 and 260 provide feedback to the charge pump 280 for regulating the voltage applied to the gate of the regulator FET 220. The normal mode divisor ratio results in the regulator FET 220 shielding the core block 210 from the high-voltage power (HVPWR) 205 and sets a normal operating value for the output voltage 206 Vdd applied to the core block 210. The comparators 230 and 240 are configured to provide feedback to the charge pump 380 to regulate the gate voltage Vg 208 of the regulator FET 220, which is configured to prevent the voltage Vdd 206 applied to the internal core block 210 to not be higher than a maximum voltage allowed by the internal voltage regulator in the normal mode 260 of operation, and to allow the voltage Vdd 206 applied to the internal core block 210 to be higher than the maximum voltage allowed by the internal voltage regulator in the test mode 250 of operation.

During test operation 250, the upper divider circuit 230 is set to divide a third fraction (e.g., approximately 3.8) that is the same as the second fraction of the lower divider circuit 240. The upper comparator circuit 250 is switched to compare the outputs of the two divider circuits 230 and 240, instead of the outputs of the divider circuits and the reference voltage 207 as done in normal mode 260. The test mode configuration sets the regulator's gate-to-source voltage 208 Vgs to be approximately equal to the output voltage 206 Vdd that is applied to the core block 210. Since the gate-to-source voltage 208 Vgs is approximately equal to the output voltage 206 Vdd (i.e., Vgs=Vdd), the regulator FET 220 is essentially turned on, resulting in the high-voltage power 205 (HVPWR) being applied to the core block 210 (i.e., Vgs=Vdd=HVPWR). With the higher voltage HVPWR 205 applied, the core block 210 can then be voltage stress tested to see if failure occurs. The stress test voltages can be varied simply by varying the value of HVPWR.

In one embodiment, the outputs of the comparators 250 and 260 are coupled to logic 270 to determine whether to enable the charge pump 280. In one embodiment, logic 270 includes an inverter 271, a gate 272 (e.g., NOR gate), and a gate 273 (e.g., NOR gate). The output of comparator 260 is coupled to the inverter 271. The output of the inverter is coupled to an input of the gate 272. The other input of gate 272 is coupled to a control signal that indicates whether the device is in test mode 250 or normal mode 260. The output of gate 272 is coupled to an input of the gate 273. The other input of the gate 273 is coupled to the output of the comparator 250. The output of the gate 273 is coupled to the charge pump 280, and provides as an output an enable signal 281. The charge pump 280 is configured to increment the gate voltage Vg 208 (voltage that is applied to the gate of the regulator FET 220) upon each edge of the clock signal 282 when the enable signal 281 is active.

Although logic 270 has been illustrated and described as having the inverter 271, and gates 272 and 273, the logic 270 may include other logic to control the enable signal 281 of the charge pump 280 as known by one of ordinary skill in the art.

The following tables include the drain-to-source voltage Vds, gate-to-source voltage Vgs, gate voltage Vg of the regulator FET 220, and the output voltage Vdd, and the parameter that is actively controlled, such as Vdd or Vgs. Table 1 includes various values of the voltages of the device for differing values of the HVWPR 205 during normal mode 260 of operation.

| HVPWR | Vds | Vdd | Vgs | Vg | parameter actively controlled |
|---|---|---|---|---|---|
| 36 V | 31 V | 5.0 V | 1.0 V | 6.0 V | Vdd |
| 5.5 V | 0.5 V | 5.0 V | 1.0 V | 6.0 V | Vdd |
| 4.0 V | 0.1 V | 3.9 V | 4.0 V | 7.9 V | Vgs |
| 2.5 V | 0.1 V | 2.4 V | 4.0 V | 6.4 V | Vgs |

Table 2 includes various values of the voltages of the device for differing values of the HVWPR 205 during test mode 250 of operation.

| HVPWR | Vds | Vdd | Vgs | Vg | parameter actively controlled |
|---|---|---|---|---|---|
| 36 V | 0.1 V | 6.9 V | 6.9 V | 13.8 V | Vgs |
| 5.5 V | 0.1 V | 5.9 V | 5.4 V | 10.8 V | Vgs |
| 4.0 V | 0.1 V | 3.9 V | 3.9 V | 7.8 V | Vgs |
| 2.5 V | 0.1 V | 2.4 V | 2.4 V | 4.8 V | Vgs |

In one embodiment, the test mode 250 may be register activated and, therefore, is a microprocessor controlled mode of operation. Alternatively, the test mode 250 may be activated using other techniques that are known by one of ordinary skill in the art.

The voltage converter 231 is configured to convert a differential voltage to a single-ended voltage referenced to a ground potential, for example, if the gate voltage Vg 208 is equal to approximately 7.9V and the output voltage Vdd 206 is approximately 3.9V, then the single-ended output voltage is 4.0V with respect to the ground potential. In particular, voltage converter 231 is configured to sense the gate-to-source voltage Vgs 216 of the regulator FET 220. The Vgs 216 is a differential voltage between the gate voltage Vg 208 and the output voltage 206 Vdd. The differential voltage is not with respect to a ground potential. In order to convert the differential voltage to be with respect to the ground potential, the voltage converter 231 converts the Vgs 216 to be the differential value with respect to the ground potential. The differential value with respect to the ground potential is input into the divider circuit 230 and divided by a fraction, such as approximately 3.2 or 3.8, as described above.

In one embodiment, the voltage converter 231 includes a resistive voltage divider to divide down the gate-to-source voltage (Vgs) 216. In another embodiment, the voltage converter 231 includes a capacitive voltage divider to divide down the Vgs 216. In one embodiment, the capacitive divider includes a high-voltage switch that is controlled using high-voltage control signals. In another embodiment, the capacitive divider includes a high-voltage switch that is controlled using low-voltage control signals. Embodiments of divider circuits that perform the differential-to-single-ended conversions are described below with respect to FIGS. 3, 4, and 6. It should also be noted that although the voltage converter 231 is illustrated as a separate block than the divider circuit 230, the voltage converter 231 and divider circuit 230 may be integrated into a single block of the DFT circuit 300.

The above embodiments described with respect to FIG. 2 are configured to disable the internal voltage regulator to voltage stress test the core block 210 of the device. These embodiments are configured to allow selection of a test voltage for stress testing at the time of testing, rather than being a fixed voltage designed into the device.

Figure 3:
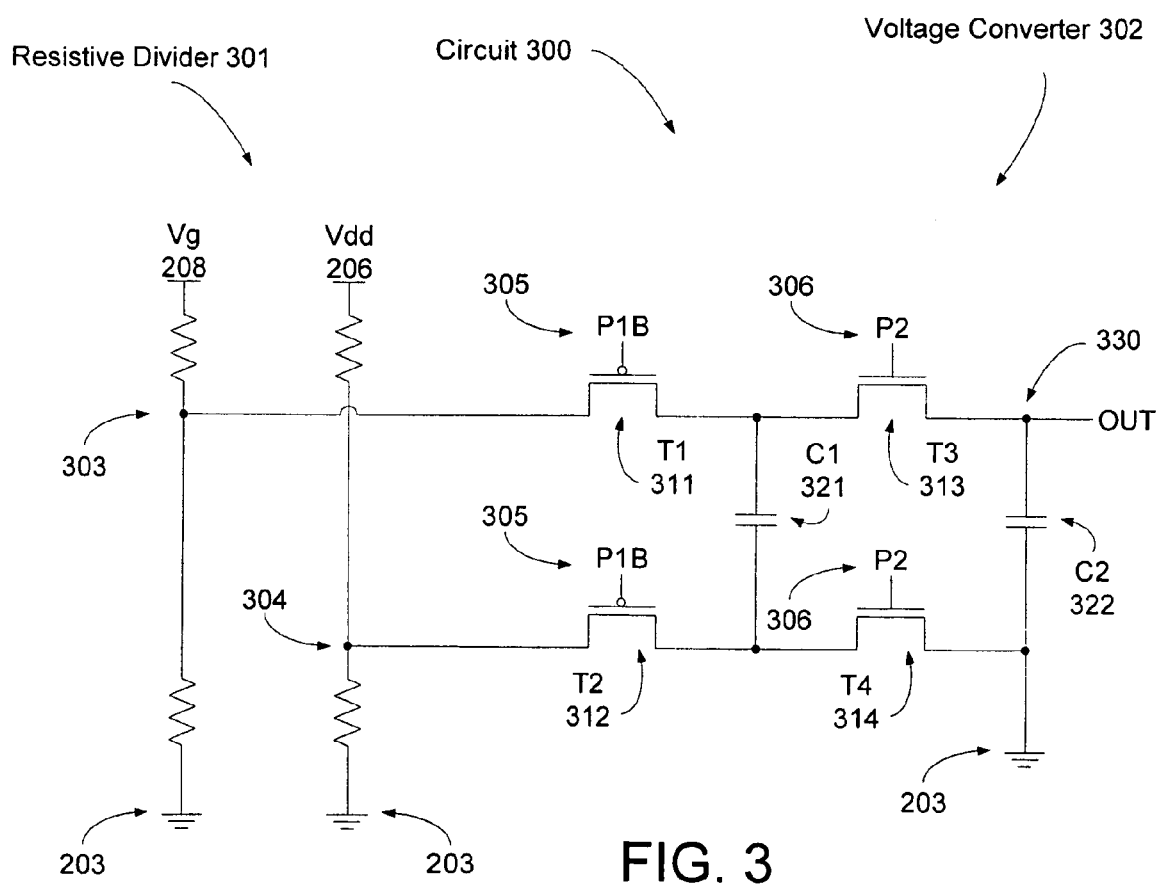
FIG. 3 illustrates a schematic of one embodiment of a circuit having a resistive divider and a voltage converter.

FIG. 3 illustrates a schematic of one embodiment of a circuit 300 having a resistive divider 301 and a voltage converter 302. The circuit 300 is configured to sense the differential voltage between Vg 206 and Vdd 208 by voltage dividing the voltages using the resistive divider 301. Different values of resistances may be used for the resistors of the resistor dividers in order to divide down the respective voltages by fractions, such as described above with respect to the divider circuits 230 and 240. The circuit 300 is also configured to perform the differential-to-single-ended conversion using switched capacitor. In particular, a first transistor T1 311 is coupled to node 303 of the divided voltage of Vg 208, and is configured to receive an inverted signal 305 (P1B) of a first control signal 306 (P1) at a gate of the first transistor T1 311. A second transistor T2 312 is coupled to node 304 of the divided voltage of Vdd 206, and is configured to receive the inverted signal 305 (P1B) at a gate of the second transistor T2 312. When the first and second transistors are activated by the inverted signal 305, a first capacitor 321 is switched in between the voltage at node 303 and the voltage at node 304, resulting in the differential voltage between Vg 206 and Vdd 208.

This differential voltage on C1 321 can be converted to a single-ended voltage referenced to ground using the voltage converter 302. The voltage converter 302 includes a third transistor, a fourth transistor and a second capacitor C2 322. The third transistor T3 313 is coupled to one end of C1 321 and one end of the C2 322. The fourth transistor T4 314 is coupled to the other end of C1 321 and ground 203. The second capacitor C2 322 is coupled between the third transistor T3 313 and ground 203. The third and fourth transistors are both configured to receive a second control signal at each of their gates, activating the third and fourth transistors to convert the differential voltage on C1 321 to a single-ended voltage on the second capacitor C2 322 at the output node 330, which is referenced to ground 203.

One disadvantage of the circuit 300 may be the size of the layout of the circuit 300. The resistive divider 301 on Vg 208 would have to be at least 20 Mega Ohms (MOhms) to limit the load on Vg 208 to the same range as the switched capacitor sampling of Vg 208 illustrated in the circuit 700 of FIG. 6, resulting in a layout that is more than 50 times larger than the circuit 700, for example.

Figure 4:
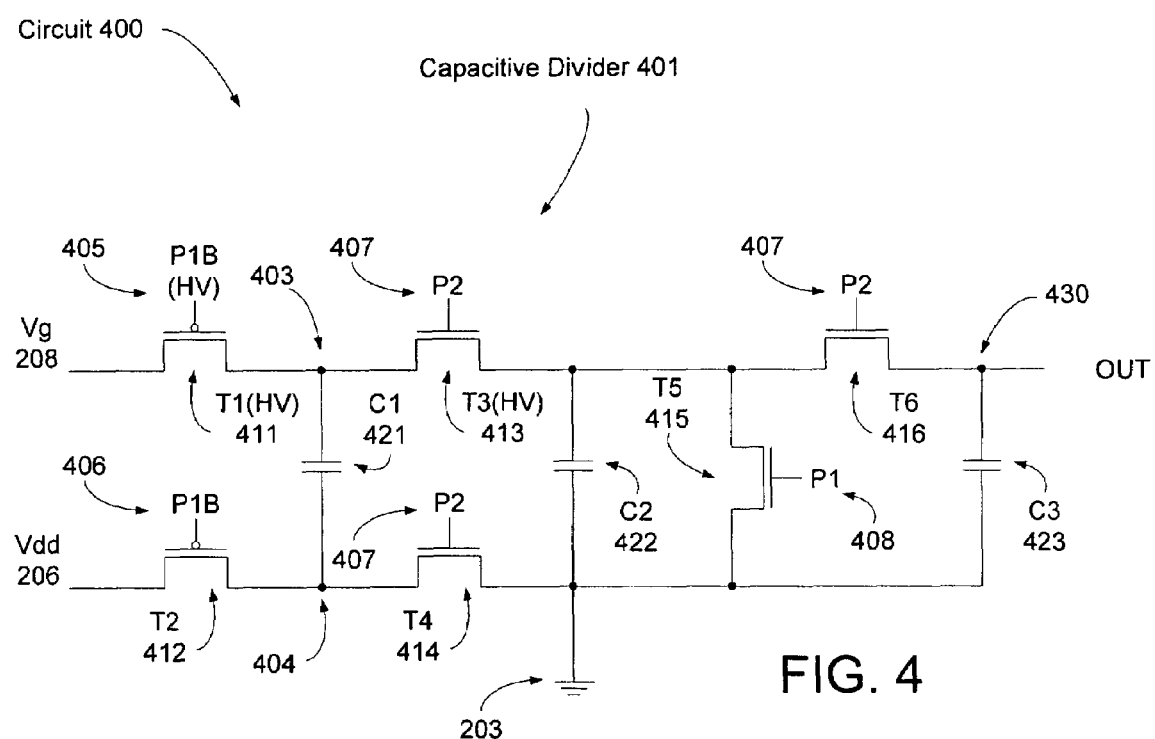
FIG. 4 illustrates a schematic of one embodiment of a circuit having a capacitive divider and a voltage converter.

Alternatively, instead of using a resistive divider, a capacitive divider may be used, such as illustrated in and described with respect to FIG. 4.

FIG. 4 illustrates a schematic of one embodiment of a circuit 400 having a capacitive divider 401 and a voltage converter 402. The circuit 400 is configured to sense the differential voltage between Vg 206 and Vdd 208 by voltage dividing the voltages using the capacitive divider 401. The circuit 400 is also configured to perform the differential-to-single-ended conversion using switched capacitors.

In this embodiment, a first transistor T1 411 is coupled between node 403 and the voltage Vg 208. However, unlike the transistors described with respect to FIG. 3, the first transistor T1 411 is a high-voltage transistor. A high-voltage transistor is a transistors that is configured to tolerate a high voltage drain-to-source voltage, such as greater than 5.0V. High-voltage transistors include a maximum allowable drain-to-source voltage that is greater than approximately 5.0V. High-voltage transistors and high voltage signals have been labeled as (HV) in the corresponding figures; otherwise, if the transistors or control signals do not include the (HV) label, the transistors or control signals are not high-voltage transistors or high voltages. In one embodiment, the high-voltage transistors are configured to tolerate up to approximately 40V drain-to-source voltage. Alternatively, other values may be used. The first transistor T1 (HV) 411 is configured to receive a high-voltage, inverted signal 405 (P1B (HV)) of a first control signal 406 (P1) at a gate of the high-voltage, first transistor T1 411. The inverted signal 405 (P1B (HV)) is a high-voltage control signal. A low-voltage control signal (P1B) is translated to a high-voltage control signal (P1B (HV)).

The circuit 400 also includes a second transistor T2 412 that is coupled between the node 404 and the voltage Vdd 206, and is configured to receive the inverted signal 406 (P1B) at a gate of the second transistor T2 412. When the first and second transistors are activated by the inverted signal 405 (HV) and the inverted signal 406, a first capacitor 421 is switched in between the voltages Vg 206 and Vdd 208, resulting in the differential voltage between Vg 206 and Vdd 208 on capacitor C1 421. The differential voltage Vg 206 with respect to Vdd 208 is sampled on C2 and then referenced to ground (a differential-to-single-ended conversion). The signal is divided down by charge sharing with C 2. Then the output capacitor, C3, is updated.

This differential voltage on C1 421 can be converted to a single-ended voltage referenced to ground using the voltage converter 402. The voltage converter 402 includes a fourth transistor T4 414 coupled between the node 404 and ground 203. The fourth transistor T4 414 is configured to receive a second control signal 407 (P2) at a gate of the fourth transistor T4 414. The control signal 407 activates the fourth transistors to reference the differential voltage between Vg 206 and Vdd 208 to ground 203.

The voltage at 403 with respect to ground 203, which represents the value of the differential voltage between Vg 206 and Vdd 208, is divided down using the capacitive divider 401. The capacitive divider 401 includes a third transistor T3 (HV) 413 disposed between node 403 and one end of a second capacitor C2 422 that has the other end coupled to ground 203. The third transistors T3 (HV) 413 is a high-voltage transistors similar to the first transistor. The third transistors T3 (HV) 413 is configured to receive the second control signal 407 (P2) at a gate of the third transistor. When the third transistor is activated, charge is shared with the second capacitor C2 422. By charge sharing the voltage on the first capacitor C1 421 with the second capacitor C2 422, the differential voltage can be divided by a fraction. The value of the capacitors can be selected to determine the fraction by which the voltage at 403 is divided.

After the charge is shared between the first and second capacitors 421 and 422, the output capacitor C3 423 is updated using a fifth transistor T5 415 and a sixth transistor T6 416. The fifth transistor 415 is configured to receive the first control signal 408 (P1) to activate the fifth transistor, and the sixth transistor 416 is configured to receive the second control signal 407 (P2) to activate the sixth transistor. When the sixth transistor 416 is activated, the voltage on the second capacitor 422 is updated on the third capacitor C3 423 at the output node 430, which is referenced to ground 203.

One disadvantage of the circuit 400 may be the generation of high-voltage control signals, such as the inverted signal 405 (P1B (HV)) of the first control signal 408 (P1), because a low-voltage control signal needs be translated into a high-voltage control signal. Additional circuitry may be used to translate the low-voltage control signal into a high-voltage control signal. The additional circuitry that translates the low-voltage control signal (P1B) into a high-voltage control signal (P1B (HV)) should not draw too much current from Vg 208, otherwise, the charge pump (e.g., charge pump 280) that supplies Vg 208 will need to be increased in size to accommodate the increased load. In addition, the translation circuit must work for all possible values of Vg 208, and the high-voltage control signal 405 needs to closely track Vg 208. When the high-voltage transistor (e.g., PMOS FET) 411, controlled by the control signal 405 (e.g., P1B (HV)) is off, the control signal 405 needs to be equal to approximately Vg 208. When the high-voltage transistor (e.g., PMOS FET) 411 is to be on, the control signal 405 needs to be more than 1V below Vg 208, but not more than 5.5V below Vg 208 to prevent damage to the high-voltage transistor 411 (e.g., high-voltage switch).

Although the layout of circuit 400 of FIG. 4 may be smaller than the layout of circuit 400 of FIG. 3 using capacitive divider, the circuit 400 of FIG. 4 still includes the disadvantage of controlling a high-voltage transistor using high-voltage control signals, such as control signal 405 (P1B (HV)). Embodiments described below with respect to FIGS. 5 and 6 are directed to controlling a high-voltage transistor (also referred to as high-voltage switch) using low-voltage control signals, instead of high-voltage control signals as described in FIG. 4.

Figure 5:
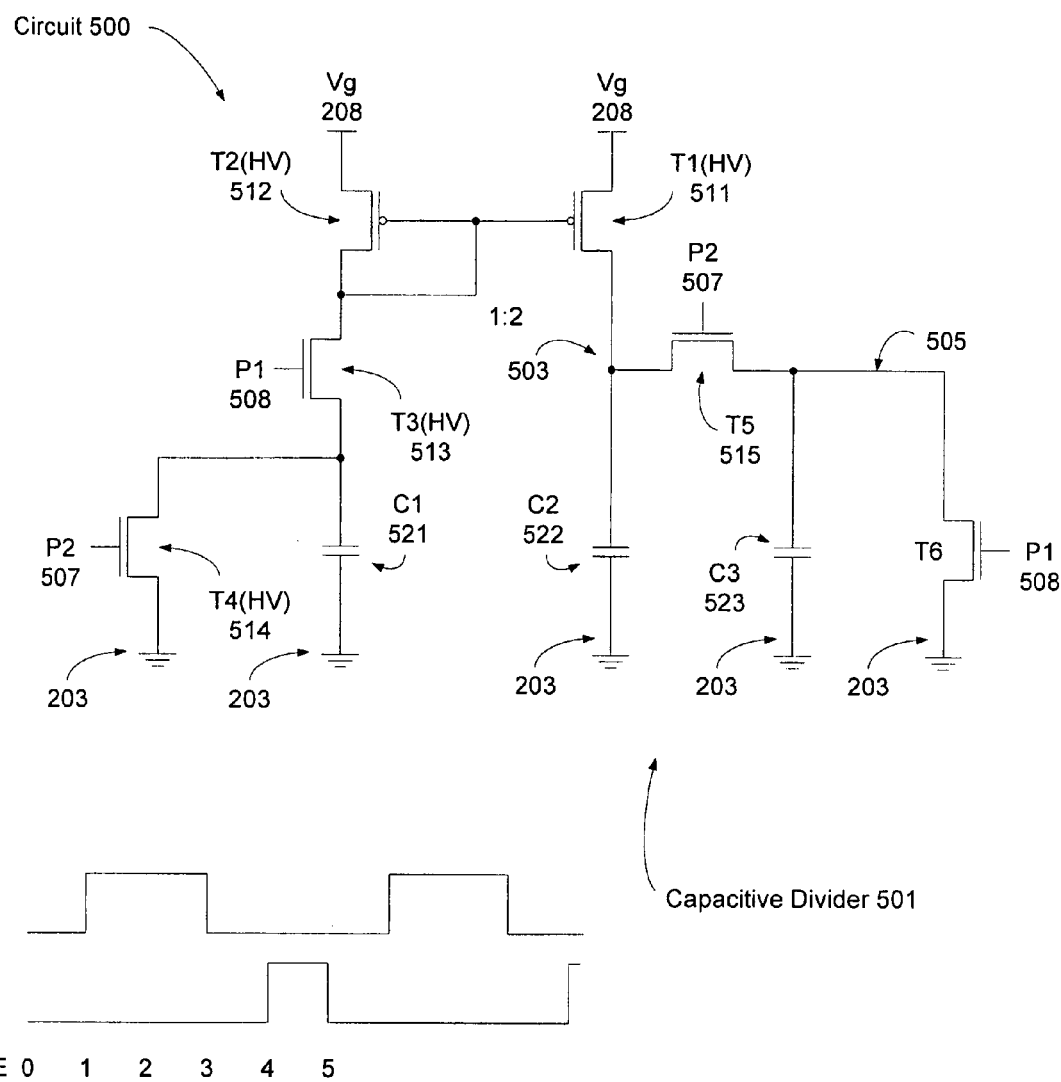
FIG. 5 illustrates a schematic of one embodiment of a circuit for controlling a high-voltage switch with low-voltage control signals.

FIG. 5 illustrates a schematic of one embodiment of a circuit 500 for controlling a high-voltage switch with low-voltage control signals. In this embodiment, the illustrated circuit controls a high-voltage transistor (e.g., PFET) with low-voltage control signals 508 (P1) and 507(P2). The circuit 500 includes a first transistor T1 511, which has its source coupled to a voltage supply of the voltage Vg 208. In one embodiment, the voltage supply is the charge pump 280. Alternatively, other voltage supplies may be used to supply the voltage Vg 208 of FIG. 5. The circuit 500 also includes a second transistor T2 512, which has its source also coupled to the voltage Vg 208. The circuit 500 also includes a third transistor T3, which has a source coupled to the gates of the first and second transistors 511 and 512. The first transistor T1 511, second transistor T2 512, and third transistor T3 513 are high-voltage transistors, and each has a maximum allowable drain-to-source voltage greater than approximately 5.0 volts. The third transistor T3 513 is configured to receive a first control signal 508 (P1) at a gate of the third transistor to turn the first and second transistors 511 and 512 on and off. In one embodiment, the first control signal 508 (P1), as well as the second control signal 507 (P2), are low-voltage control signals, in that the voltage of the first control signal 508 (P1) can be produced by logic operating at a low voltage. In this embodiment, the first, second, and third transistors are high-voltage transistors, having a maximum allowable drain-to-source voltage greater than approximately 5.0V; however, unlike the high-voltage transistors of FIG. 4, the high-voltage transistors of FIG. 5 are controlled using low-voltage control signals (e.g., are less than or equal to approximately 5.0V).

The circuit 500 also includes a first capacitor C1 521 coupled between a ground potential 203 and a drain of the third transistor T3 513, and a second capacitor C2 522 coupled between the ground potential 203 and a drain of the first transistor T1 511. The second capacitor 522 is configured to be charged faster than the first capacitor 521.

At time T=0, capacitors C1 521 and C2 522 are discharged and T2 512 and T3 513 are OFF. At T=1, the low-voltage control signal 508 (P1) is activated (e.g., goes HIGH), turning on T3 513. With T3 513 on, current flows from gate voltage Vg 208 through T2 512 and T3 513 onto capacitor C1 521. Since the gates of transistors T1 511 and T2 512 are connected, transistor T1 511 (e.g., the high-voltage PFET to be controlled) is also turned on. A current twice the size of the first current flows into capacitor C2 522 due to the 1:2 current mirror configuration. In one embodiment, the capacitance of the first and second capacitor 521 and 522 are the same, the second capacitor C2 522 is charged up to the gate voltage Vg 208 before current stops flowing into the first capacitor C1 521. Alternatively, the first and second capacitors can be configured to be different capacitances so long as the voltage on the second capacitor C2 522 charges to the gate voltage Vg 208 before current stops flowing into the first capacitors C1 521.

At time T=3, the first control signal 508 is de-activated (e.g., P1 goes LOW), open circuiting T3 513, cutting off current through both branches of the current mirror circuit and turning off T1 511 and T2 512. At T=4, the second control signal 507 P2) is activated (e.g., P2 goes HIGH) to discharge the first capacitor C1 521, preparing the circuit 500 ready for the next time the first control signal (P1) is activated (e.g., asserted HIGH) to turn on transistors T1 511 and T2 512. Accordingly, low-voltage control signals are used to control the switching of a high-voltage switch (e.g., turning on and off the high-voltage transistors.

In another embodiment, the circuit 500 also includes a fifth transistor T5 515 coupled between the second capacitor C2 522 and a third capacitor C3 523. The third capacitor 523 is coupled to the drain of the fifth transistor T5 515 and the ground potential 203. The fifth transistor T5 515 is configured to receive the second control signal 507 (P2) at a gate of the fifth transistor to divide a charge on the capacitor C2 522 at node 503 between the capacitor C2 522 and the third capacitor C3 523.

Also, at T=4, the second control signal 507 (P2) is activated (e.g., P2 goes HIGH) to divide down the voltage on the second capacitor C2 522 by charge sharing with a third capacitor C3 523, as described above with respect to the fifth transistor T5 515. By charge sharing the voltage on the second capacitor C2 522 with the third capacitor C3 523, the gate voltage Vg 208 can be divided by a fraction. The value of the capacitors can be selected to determine the fraction by which the voltage at 503 is divided. The voltage at node 504 is the divided down voltage using the capacitive voltage divider 502.

In another embodiment, the circuit 500 also includes a sixth transistor T6 516 coupled between the capacitor C3 523 and the ground potential 203. The sixth transistor T6 516 is configured to receive the first control signal 508 at a gate of the sixth transistor T6 516 to reset the third capacitor C3 523 for the subsequent turn on of the sixth transistor node.

FIG. 5 also illustrates a timing diagram of the first and second control signals 508 and 507, respectively. The first control signal 508 is activated and de-activated first and then the second control signal 507 is activated and de-activated. This process repeats, alternating between activating and de-activating the first and second control signals 508 and 507, respectively. Alternatively, other timing may be accomplished as known by one of ordinary skill in the art.

The circuit described herein may place a relatively small load current on the gate voltage Vg 208 to obtain control of the high-voltage switch (e.g., first transistor T1 511). The circuit achieves control of high-voltage switches with relatively few circuit elements.

Embodiments of the present have been illustrated with metal-oxide-semiconductor field-effect-transistor (MOSFET) technology (e.g., NMOS or n-channel MOSFET or PFET or p-channel FET for the high-voltage switch) for ease of discussion. In alternative embodiments, other device types (e.g., Bipolar and BiCMOS, PMOS and CMOS) and process technologies, for example, Bipolar and BiCMOS, may be used. It should be noted that the circuits described herein may be designed utilizing various voltages.

FIG. 6 illustrates a schematic of one embodiment of a circuit 600 having a capacitive divider 601 and a voltage converter 602 and a circuit 603 for controlling high-voltage transistors using low-voltage control signals. Circuit 603 is a similar circuit as described with respect to FIG. 5, which includes the transistors T1-T4 511-514 and the first and second capacitors 521 and 522. In particular, the circuit 600 is similar to the circuit 500, except circuit 600 also includes a switch and a capacitor for sampling and holding the output at node 605. The output at node 605 is available at all times whereas the output at node 505 of FIG. 5 is only accurate at the end of cycle of the second control signal 507 (P2) at time=5. The output at node 605 of FIG. 5 is at ground potential 203 while the first control signal 508 (P1) is HIGH.

The circuit 603 is coupled to the voltage converter 602, which include the fifth and sixth transistors T5 615 and T6 616 coupled to the other end of the second capacitor 622. The fifth transistor 615 is configured to receive an inverted signal 609 of the first control signal 608 at a gate of the fifth transistor to couple the second capacitor to a voltage potential. In this embodiment, the voltage potential is the output voltage Vdd 206, as described with respect to FIG. 2 above. Alternatively, other voltages may be used. The sixth transistor 616 is coupled between the second capacitor 622 and the ground potential 203. The sixth transistor 616 is configured to receive the second control signal 607 to convert a differential voltage (Vg-Vdd) between a drain voltage (e.g., Vg 208) of the first transistor 611 and the voltage potential (e.g., Vdd 206) to a voltage, having a value of the differential voltage, referenced to the ground potential 203.

The circuit 603 is also coupled the capacitive divider circuit 601. The capacitive divider circuit 601 includes a seventh transistor T7 617 coupled to the drain of the first transistor T1 611 at node 603 and a third capacitor C3 623, which is coupled to the ground potential 203. The seventh transistor T7 617 is configured to receive the second control signal 607 to divide a charge on the second capacitor C2 622 between the second capacitor 622 and the third capacitor 623.

In another embodiment, the circuit 600 includes an eighth transistor T8 618 coupled between the node 604 and the ground potential 203. The eighth transistor T8 618 is configured to receive the first control signal 608 at a gate of the eighth transistor to reset the third capacitor C3 623 for the subsequent turn on of the seventh transistor T7 617.

In another embodiment, the circuit 600 includes a ninth transistor T9 619 coupled between the node 604 (one end of the third capacitor C3 623) and the output node 605, which is at the one end of the fourth capacitor C4 624, while the other end is coupled to the ground potential 203. The ninth transistor T9 619 is configured to receive the second control signal 607 at a gate of the ninth transistor to transfer a charge on the third capacitor C3 623 to the fourth capacitor C4 624. The fourth capacitor C4 624 is configured to store a charge of a previous cycle. Accordingly, when the ninth transistor T9 619 receives the second control signal 607 at the gate, the ninth transistor T9 619 is configured to adjust up or adjust down a charge on the fourth capacitor C4 624 based on the charge of the previous cycle.

FIG. 6 also illustrates a timing diagram of the first and second control signals 608 and 607, and the inverted control signal 609, respectively. The first control signal 608 is activated and de-activated first and then the second control signal 607 is activated and de-activated. The inverted control signal 609 is the inverted signal of the first control signal 608. At time period 1, P2 607 is HIGH and P1 608 is LOW. The capacitor C1 621 is discharged to ground. At time period 2, P1 608 is HIGH and P2 607 is LOW. Current flows into C1 621 until the voltage on C1 621 is high enough to turn off the high voltage transistor 611 (e.g., PMOS FET) connected to Vg 208 in branch having the first capacitor C1 of the circuit 600. The current is mirrored into the capacitor C2 622. Since the ratio of the current mirror is two and the capacitance C1 is greater than C2, C2 is fully charged to Vg 208. This allows the high-voltage transistor T1 611 to be turned on and off using low-voltage control signals. Since the second capacitor's 622 bottom plate is connected to the voltage Vdd 206, the C2 622 is charged with the differential voltage (e.g., Vgs 216) of Vg 208 less Vdd 206 (e.g., Vg−Vdd). The voltage Vgs 216 is gate-to-source voltage of the regulator FET 220 of FIG. 2. The capacitor C3 623 is discharged to ground. The fourth capacitor C4 624 remains charged to the result of the previous cycle. At time period 3, the P2 607 is HIGH and P1 608 is LOW. The current mirror is off and the C2 622 is referenced to ground. This performs a differential-to-single-ended conversion. Since P2 607 is HIGH, the top plates of the C2 622 and C3 623 are connected. Since C3 623 was previously discharged, the charge on C2 622 is shared between C2 622 and C3 623. If C2 622 and C3 623 are sized properly, the sampled voltage Vgs 216 is divided by a fraction, such as approximately 3.2, as described above. Also during this clock phase, the C4 624 is connected to the divided down voltage Vgs 216 at node 604. Since the C4 624 was charged to the previous output, the output is adjusted up or down depending on the sampled divided down voltage Vgs 216 at node 604. This process repeats, alternating between activating and de-activating the first and second control signals 608 and 607, respectively. Alternatively, other timing may be accomplished as known by one of ordinary skill in the art.

The embodiments described above for controlling high-voltage transistors using low-voltage control signals may be used to reduce a current load on the voltage source, such as the charge pump 280. The embodiments described above for controlling high-voltage transistors using low-voltage control signals may be used to reduce die area of the circuit.

Figure 7:
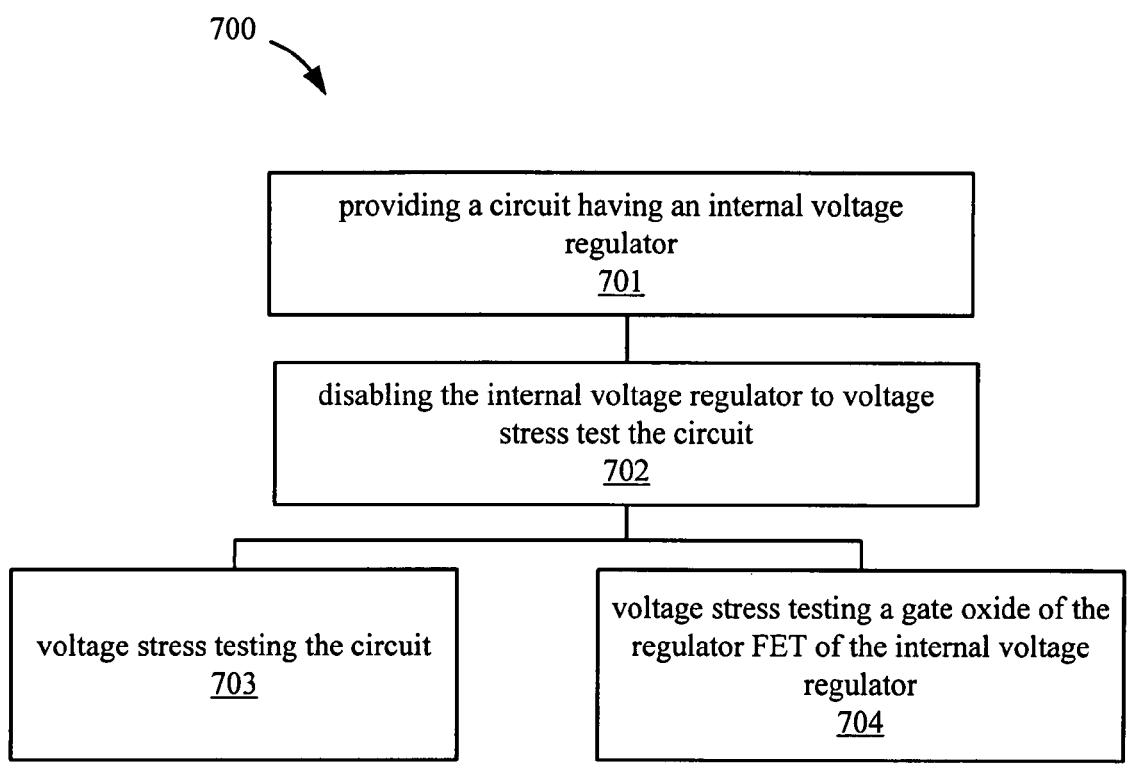
FIG. 7 illustrates a flow chart of one embodiment of a method for disabling an internal voltage regulator of a circuit to voltage stress test the circuit.

FIG. 7 illustrates a flow chart of one embodiment of a method 700 for disabling an internal voltage regulator of a circuit to voltage stress test the circuit. Method 700 includes providing a circuit having an internal voltage regulator, operation 701, and disabling the internal voltage regulator to voltage stress test the circuit, operation 702. In operation 702, although the internal voltage regulator is no longer regulating, the internal voltage regulator functions as a switch connecting the high voltage supply to the internal supply voltage and causes the gate-to-source voltage of the regulating FET to be equal to the internal supply voltage. The method 700 may also include voltage stress testing the circuit, operation 703, and/or voltage stress testing a gate oxide of the regulator FET of the internal voltage regulator, operation 704. As part of voltage stress testing the internal core block, the method includes applying a voltage to the internal core block that is higher than a maximum voltage allowed by the internal voltage regulator.

In one embodiment, the operation of disabling the internal voltage regulator includes sensing the gate-to-source voltage Vgs of the regulator FET, sensing a voltage (Vdd) applied to the internal core block, comparing the voltage Vdd and the Vgs, and controlling the Vgs of the regulator FET, based on the comparison of the voltage Vdd and the Vgs, to allow the voltage Vdd applied to the internal core block to be higher than a maximum voltage allowed by the internal voltage regulator.

In another embodiment, the method 700 includes selecting at least one of a test mode of operation or a normal mode of operation. The operation of disabling the internal voltage regulator of the circuit includes disabling the internal voltage regulator while in the test mode.

Figure 8:
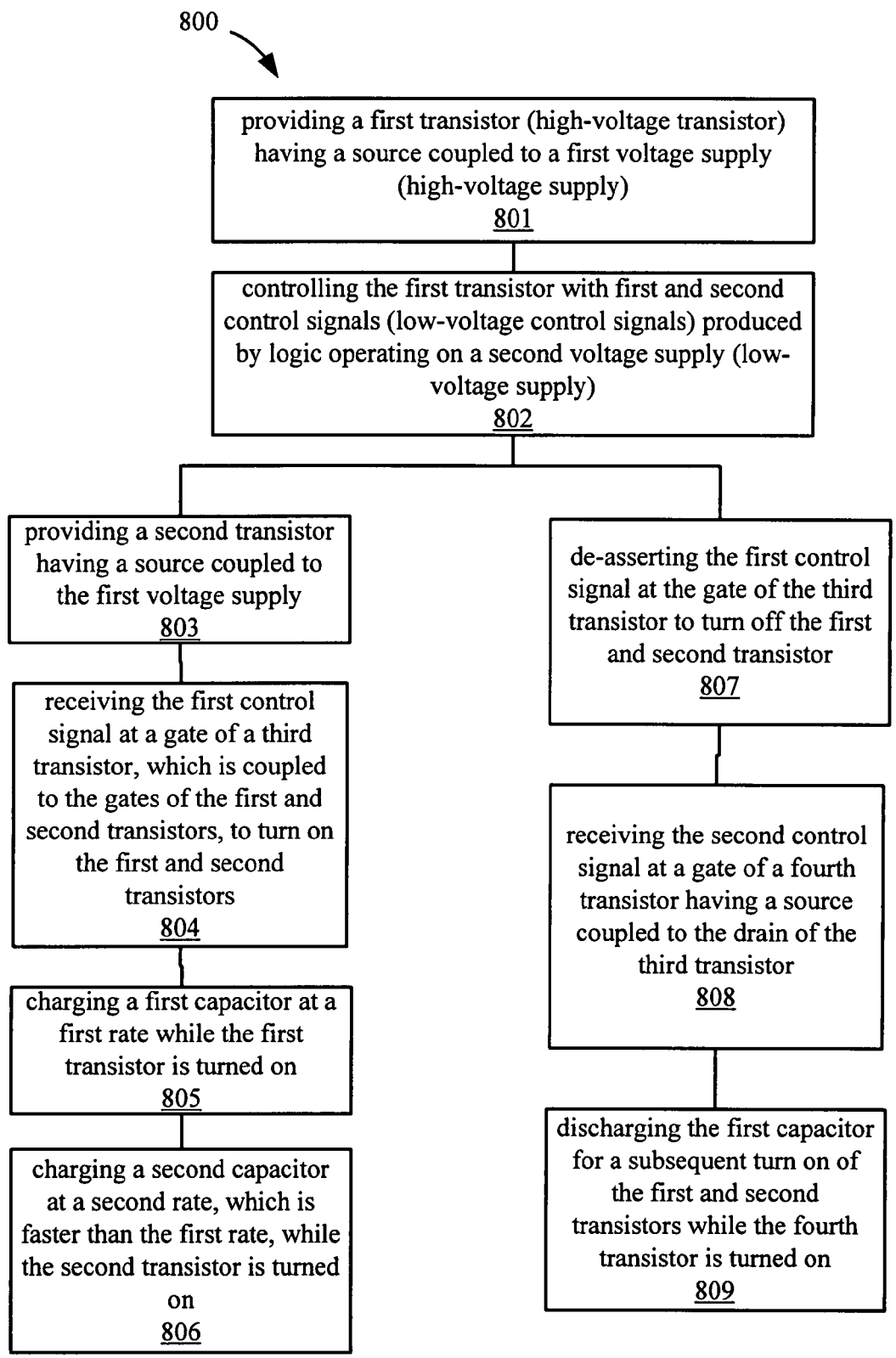
FIG. 8 illustrates a flow chart of one embodiment of a method for controlling a high-voltage transistor using low-voltage control signals.

FIG. 8 illustrates a flow chart of one embodiment of a method 800 for controlling a high-voltage transistor using low-voltage control signals. Method 800 includes providing a first transistor having a source coupled to a first voltage supply (e.g., high-voltage supply that is greater than 5.0V), operation 801. The first transistor has a maximum allowable drain-to-source voltage greater than approximately 5.0 volts. The method 800 also includes controlling (e.g., turning on and off) the first transistor with first and second low-voltage control signals (e.g., less than or equal to 5.0V), operation 802. The first and second low-voltage control signals may be produced by logic operating on a second voltage supply that is a low-voltage supply (e.g., 5V or less) relative to the first voltage supply (e.g., high-voltage supply). The maximum voltage of the first and second control signals is less than the maximum allowable drain-to-source voltage of the first transistor.

The method 800 also includes turning on the first transistor by providing a second transistor (high-voltage transistor) having a source coupled to the first voltage supply (e.g., high-voltage supply), operation 803. The operation of turning on the first transistor includes receiving the first control signal at a gate of a third transistor, which is coupled to the gates of the first and second transistors, to turn on the first and second transistors, operation 804. The operation of turning on the first transistor includes charging a first capacitor at a first rate while the first transistor is turned on, operation 805. The operation of turning on the first transistor also includes charging a second capacitor at a second rate, which is faster than the first rate, while the second transistor is turned on, operation 806.

The method 800 also includes turning off the first transistor by de-asserting the first control signal at the gate of the third transistor to turn off the first and second transistors, operation 807. The operation of turning off the first transistor also includes receiving the second control signal at a gate of a fourth transistor having a source coupled to the drain of the third transistor, operation 808, and discharging the first capacitor for a subsequent turn on of the first and second transistors while the fourth transistor is turned on, operation 809.

The operation of turning off the first transistor may also include receiving an inverted signal of the first control signal at a gate of a fifth transistor to couple the second capacitor to a voltage potential, receiving the second control signal at a gate of a sixth transistor to activate the sixth transistor, and converting a differential voltage between a drain voltage of the first transistor and the voltage potential to a voltage with respect to ground when the sixth transistor is activated. The inverted signal may be produced by logic operating on the second voltage supply (e.g., low-voltage supply).

The operation of turning off the first transistor may also include receiving the second control signal at a gate of a seventh transistor to activate the seventh transistor, and dividing a charge on the second capacitor between the second capacitor and a third capacitors that is coupled to a drain of the seventh capacitor and the ground potential when the seventh transistor is activated.

The embodiments described above with respect to controlling a high-voltage transistor using low-voltage control signals may be used to reduce a current load on a voltage supply, such as a charge pump. The embodiments described above may be used to reduce the die area of the circuit.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
    providing a circuit having an internal voltage regulator; and
    disabling the internal voltage regulator to voltage stress test the circuit, wherein the internal voltage regulator comprises a regulator field-effect transistor (FET) and the circuit comprises an internal core block coupled to the regulator FET,
    wherein disabling the internal voltage regulator comprises:
    sensing a gate-to-source voltage (Vgs) of the regulator FET;
    sensing a voltage applied to the internal core block;
    comparing the voltage and the Vgs; and
    controlling the Vgs of the regulator FET, based on the comparison of the voltage and the Vgs, to allow the voltage applied to the internal core block to be higher than a maximum voltage allowed by the internal voltage regulator.

2. The method of claim 1, further comprising selecting at least one of a test mode of operation or a normal mode of operation, wherein disabling the internal voltage regulator of the circuit comprises disabling the internal voltage regulator while in the test mode.

3. The method of claim 1, further comprising voltage stress testing the circuit.

4. The method of claim 3, wherein voltage stress testing the circuit comprises voltage stress testing a gate oxide of the regulator FET.

5. The method of claim 3, wherein voltage stress testing the circuit comprises voltage stress testing the internal core block.

6. The method of claim 5, wherein voltage stress testing the internal core block comprises applying a voltage to the internal core block that is higher than a maximum voltage allowed by the internal voltage regulator.

7. An apparatus, comprising:
    a circuit having an internal voltage regulator; and
    a design-for-test (DFT) circuit coupled to the circuit to disable the internal voltage regulator to voltage stress test the circuit in a test mode, wherein the internal voltage regulator comprises a regulator field-effect transistor (FET), and wherein the circuit comprises an internal core block coupled to the regulator FET, wherein the DFT circuit comprises:
    a first divider circuit coupled to sense a gate-to-source voltage (Vgs) of the regulator FET;
    a second divider circuit to sense a voltage applied to the internal core block; and
    a first comparator to compare an output of the first divider circuit and an output of the second divider circuit to control a voltage applied to the internal core block that is higher than a maximum voltage allowed by the internal voltage regulator.

8. The apparatus of claim 7, wherein the DFT circuit further comprises a charge pump coupled to a gate of the regulator FET and coupled to receive an output of the first comparator, wherein the charge pump is configured to set the voltage of the gate of the regulator FET approximately equal to the voltage applied to the internal core block to allow the voltage applied to the internal core block to be higher than the maximum voltage allowed by the internal voltage regulator.

9. The apparatus of claim 7,
    wherein the first divider circuit is configured to divide the Vgs by approximately 3.2 in a normal mode of operation and by approximately 3.8 in a test mode of operation;
    wherein the second divider circuit is configured to divide the voltage by approximately 3.8 in both the normal mode of operation and the test mode of operation;
    wherein the DFT circuit comprises:
    a charge pump coupled to the regulator FET of the internal voltage regulator;
    the first comparator to compare an output of the first divider circuit and an output of the second divider in the test mode of operation, and the output of the first divider circuit and a reference voltage in the normal mode of operation; and
    a second comparator to compare the output of the second divider circuit and the reference voltage in the normal mode of operation, wherein the first and second comparators are configured to provide feedback to the charge pump to regulate the gate voltage of the regulator FET, wherein the regulator FET is configured to prevent the voltage applied to the internal core block to not be higher than a maximum voltage allowed by the internal voltage regulator in the normal mode of operation, and wherein the regulator FET is activated to allow the voltage applied to the internal core block to be higher than the maximum voltage allowed by the internal voltage regulator in the test mode of operation.

10. The apparatus of claim 7, further comprising a microcontroller coupled to the DFT circuit to select at least one of the test mode of operation and a normal mode of operation.

11. The apparatus of claim 7, wherein the DFT circuit is configured to voltage stress test the internal core block.

12. The apparatus of claim 7, wherein the DFT circuit is configured to voltage stress test a gate oxide of the regulator FET.

13. The apparatus of claim 7, wherein the apparatus has the test mode of operation and a normal mode of operation, wherein the DFT circuit in the test mode is configured to allow application of a voltage to the internal core block that is higher than a maximum voltage allowed by the internal voltage regulator of the circuit.

* * * * *